United States Patent [19]

Imura et al.

[11] Patent Number: 5,604,059

[45] Date of Patent: Feb. 18, 1997

[54] MASK STRUCTURE HAVING PHASE SHIFTING PATTERN SUITABLE FOR FORMING FINE PATTERN ON PHOTOSENSITIVE FILM AND METHOD OF MANUFACTURING SOLID-STATE DEVICES USING SUCH MASK STRUCTURE

[75] Inventors: Ryo Imura, Tokorozawa; Yoshinori Hoshina, Fuchu; Kengo Asai; Mitsutaka Hikita, both of Hachioji; Atsushi Isobe, Kodaira; Ryo Suzuki, Hachioji; Kohji Oda, Yokohama; Kazuyuki Sakiyama, Chigasaki, all of Japan

[73] Assignee: Hitachi, Ltd., Tokyo, Japan

[21] Appl. No.: 290,603

[22] Filed: Aug. 15, 1994

Related U.S. Application Data

[63] Continuation of Ser. No. 685,845, Apr. 16, 1991, abandoned.

[30] Foreign Application Priority Data

Apr. 27, 1990 [JP] Japan .................. 2-109997

[51] Int. Cl.[6] ..................... G03F 7/12; G03F 7/20
[52] U.S. Cl. ................... 430/5; 430/311; 430/394; 430/396
[58] Field of Search ................ 430/5, 311, 394, 430/396, 397

[56] References Cited

U.S. PATENT DOCUMENTS

| | | | |
|---|---|---|---|
| 5,132,195 | 7/1992 | Pool | 430/394 |
| 5,286,584 | 2/1994 | Gemmink | 430/5 |
| 5,330,878 | 7/1994 | Nelson | 430/397 |

*Primary Examiner*—Kathleen Duda
*Attorney, Agent, or Firm*—Fay Sharpe Beall Fagan Minnich & McKee

[57] ABSTRACT

A mask structure has two (or more) groups of device patterns formed on one transparent support plate. Each of the device patterns has a transparent partial pattern. One or both of the groups of device patterns are provided with phase shifting patterns for improvement of the resolution in the lithography. The transparent partial pattern in each of the device patterns in each of the device pattern groups is determined such that each of the transparent partial patterns held by one of the device pattern groups is adapted for combination with one transparent partial pattern held by the other device pattern group by two or more times of transmission of an exposure beam through the mask structure. Manufacturing of solid-state devices is possible by use of the mask structure, in which exposure of a photo-sensitive film on a substrate to an exposure beam through the mask structure is repeated two or more times with a relative position between the mask structure and the substrate being changed.

13 Claims, 9 Drawing Sheets

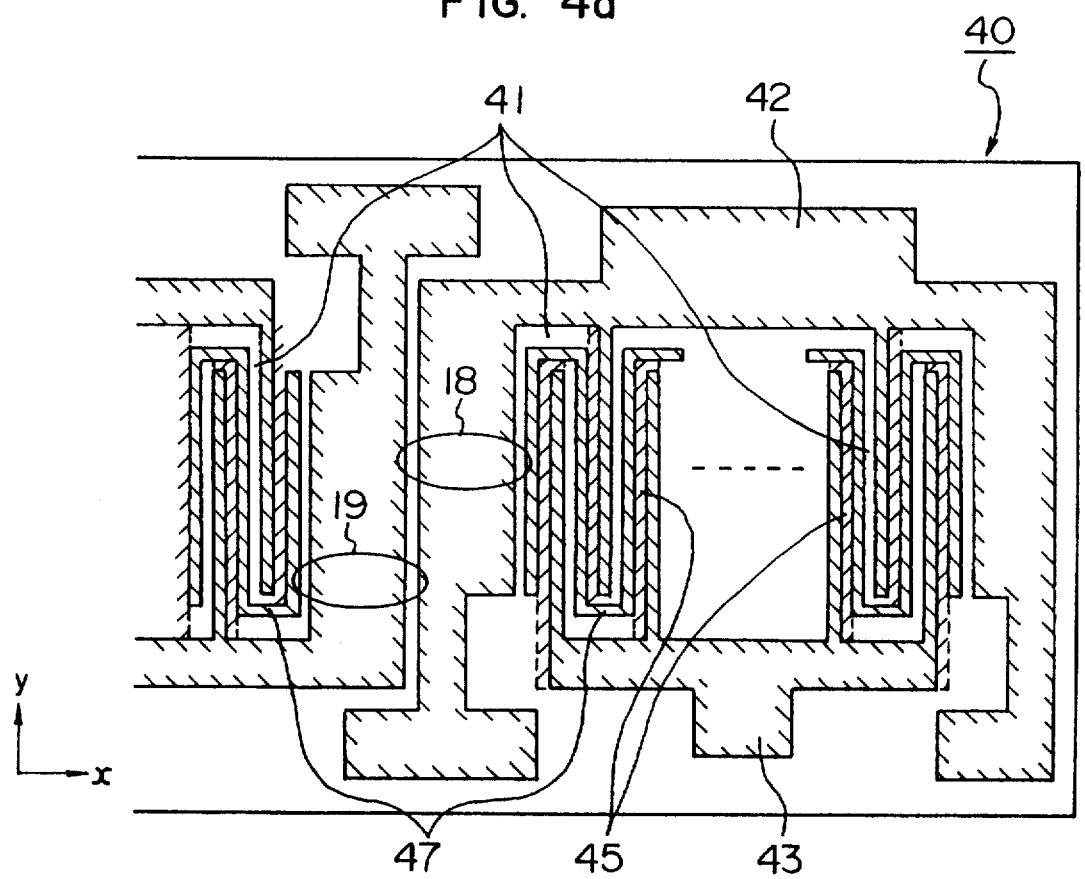

MASK STRUCTURE HAVING PHASE SHIFTING PATTERN SUITABLE FOR FORMING FINE PATTERN ON PHOTOSENSITIVE FILM AND METHOD OF MANUFACTURING SOLID-STATE DEVICES USING SUCH MASK STRUCTURE

This is a continuation of application Ser. No. 07/685,845 filed on Apr. 16, 1991, now abandoned.

BACKGROUND OF THE INVENTION

The present invention relates to a mask structure which is used for manufacturing solid-state devices having fine pattern structures such as semiconductor integrated circuit devices and surface acoustic wave (SAW) devices, and a method of manufacturing solid-state devices by using such a mask structure.

Specifically, a SAW device obtained by using the present invention is suitable for use in a communication apparatus such as a radio communication terminal.

In a projection aligner (or a projection type exposure apparatus) a photo-mask or a reticle is illuminated by an illuminating optical system to transfer a circuit pattern onto a photosensitive film provided on a substrate. To transfer a fine pattern having a minimum width which approximates the resolution limit of the projection aligner, a technique has been proposed for producing a phase difference between light beams passing through two adjacent apertures having a fine opaque pattern segment therebetween. A conventional method of forming a pattern so that the above phase difference is produced, is discussed in an article entitled "Improving Resolution in Photolithography with a Phase-Shifting Mask" by Mark D. Levenson et. al. (IEEE Trans. on Electron Devices, Vol. ED-29, No. 12, 1982, pages 1828 to 1836). According to the pattern forming method proposed in the above article, exposure beams having passed through two adjacent apertures with a fine opaque pattern segment therebetween are 180° out of phase with each other. This method is suitable for improving the resolution of a pattern made of periodically arranged pattern segments.

The above-mentioned prior art is effective in improving the resolution of a pattern where two adjacent transparent apertures are isolated from each other by a fine opaque pattern segment. However, where the adjacent transparent apertures are connected at a position to form, for example, a U-shaped aperture pattern segment, it is impossible to produce a phase difference between exposure beams on both sides of the fine opaque pattern segment. Thus, in this situation it is impossible to form a circuit pattern an improved resolution.

Further, in many cases, the circuit pattern of a solid-state device or electronic device is formed so that end faces of adjacent linear aperture pattern segments are connected with each other. When the conventional pattern forming method for producing the phase difference is applied to such a circuit pattern, the phase of exposure light is abruptly changed at a portion of, for example, a U-shaped aperture pattern segment. Thus, the resolution of that part of the U-shaped aperture pattern segment where linear patterns are parallel to each other, is improved, but the U-shaped aperture pattern segment is separated into two parts. As a result, it becomes impossible to form a desired, united aperture pattern segment on a wafer.

SUMMARY OF THE INVENTION

It is an object of the present invention to provide a mask structure having opaque areas and transparent areas in which a size of at least a portion of at least one of the opaque areas is defined by one of the transparent areas adjacent to that opaque area.

It is another object of the present invention to provide a method of manufacturing solid-state devices having a fine pattern structure.

According to one aspect of the present invention, a mask structure has two or more groups of different device patterns formed on one transparent support plate. Each of the device pattern groups includes a plurality of identical device patterns. Device patterns in one device pattern group are different from those included in another pattern group. Each of the device patterns holds a transparent partial pattern. At least one device pattern group among the device pattern groups is provided with a phase shifting pattern for improvement of the resolution in the lithography. The transparent partial pattern held by each of the device patterns in each of the device pattern groups is determined such that each of the transparent partial patterns held by one of the device pattern groups is adapted for combination with one transparent partial pattern held by another device pattern.

According to another aspect of the present invention, manufacturing of solid-state devices is possible by use of the above-described mask structure, in which exposure of a photo-sensitive film on a substrate to an exposure beam through the mask structure is repeated two or more times with a relative position between the mask structure and the substrate being changed.

According to a further aspect of the present invention, a mask structure is formed by arranging each of a plurality of device pattern groups periodically on a transparent support plate, the device pattern groups are superposed on each other at an area of the surface of a substrate (that is, wafer) by performing an exposure/transfer operation a plurality of times to form a plurality of identical, united patterns on the substrate (in other words, the mask structure is moved with respect to the substrate so that a desired pattern is formed of exposure beams having passed through a plurality of kinds of device patterns). Thus, an abrupt change in the phase of an exposure beam occurs at any portion of a transparent aperture pattern segment which is to be one united body. Accordingly, there is no fear of generating the undesirable separation of an aperture pattern segment.

By dividing a continuous transparent area of a lithography mask pattern into two or more transparent partial patterns and by preparing two or more device patterns, transparent pattern segments for forming the transparent partial pattern of each device pattern can be isolated from each other by an opaque area. In a transparent partial pattern where adjacent transparent pattern segments are isolated from each other, exposure beams having passed through the adjacent transparent pattern segments can be made different in phase from each other, for example, a phase difference of 180° can be produced between the exposure beams. Moreover, an abrupt change in phase of exposure light from 0° (180°) to 180° (0°) at a portion of the continuous transparent area of the lithography mask pattern is prevented.

Further, when exposure beams having passed through transparent pattern segments of a transparent partial pattern are periodically given a phase difference of, for example, about 180°, the resolution of a pattern which has been transferred on a substrate is improved.

Furthermore, when a plurality of device pattern groups are arranged on a transparent support plate at a predetermined internal to form a mask structure, and an exposure operation is performed each time the mask structure is moved with respect to a substrate by a distance associated with the above interval, a plurality of patterns are formed on each of the areas (that is, chips) on the substrate. When device patterns arranged on a transparent support plate at a predetermined interval to form groups (or rows) of device patterns, and the device pattern groups are transferred on a substrate (that is, a wafer), exposure/transfer operations can be performed at a high resolution, and moreover, a poor resolution of the transferred pattern does not occur, since adjacent transparent pattern segments of the transparent partial pattern of each device pattern have no connecting portion.

Further, when different device patterns are superposed on each other at one area of a substrate by performing exposure/transfer operations a plurality of times, a lithography pattern can be formed in which the size of an opaque pattern segment is defined by one united transparent area (for example, a U-shaped transparent area) adjacent to the opaque pattern segment. In other words, it is possible to form a transparent pattern at a high resolution which pattern may result from removal of a portion of an opaque area through which two adjacent transparent areas were isolated. Further, when device patterns are arranged on a transparent support plate at a predetermined interval associated with the size of a chip to form device pattern groups and a plurality of device pattern groups are arranged on the plate, identical lithography patterns can be formed on almost all chips of a substrate at the same time by using a single mask structure.

BRIEF DESCRIPTION OF THE DRAWINGS

FIGS. 4a to 4c are schematic diagrams showing a lithography pattern which is to be realized by another embodiment of the present invention, device patterns for realizing the lithography pattern, and the arrangement of a phase shifting film on each of the device patterns.

DESCRIPTION OF THE PREFERRED EMBODIMENTS

An embodiment of the present invention will be explained below, with reference to FIGS. 1a to 1d.

Figure 1A:
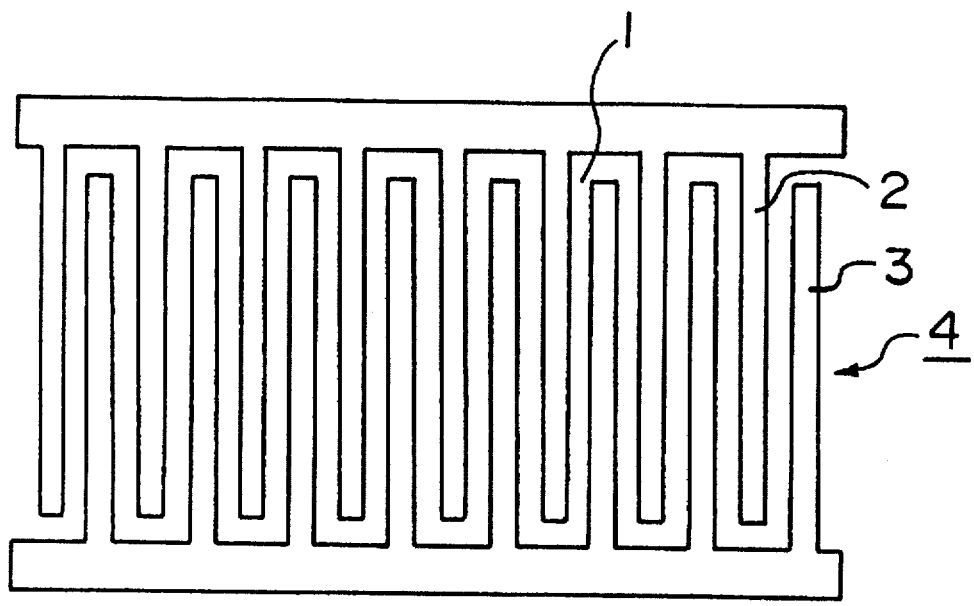
FIGS. 1a to 1d are schematic diagrams showing an interdigital pattern (that is, lithography pattern) which is to be realized by an embodiment of the present invention, device patterns for realizing the lithography pattern, and the arrangement of a phase shifting film on each of the device patterns.
Figure 1B:
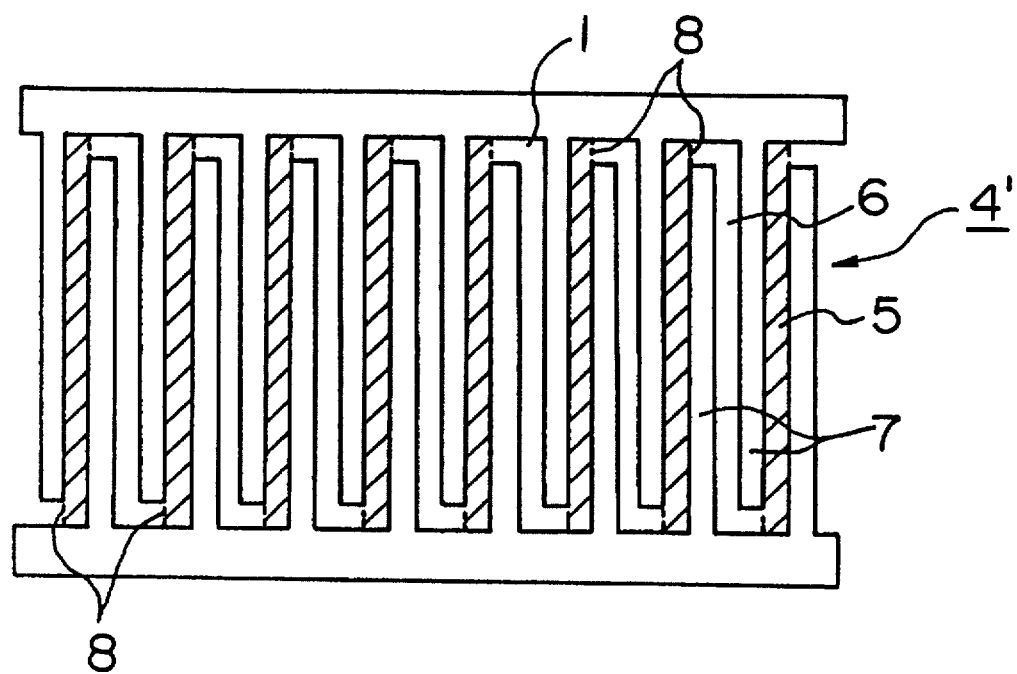

FIG. 1a shows an interdigital mask pattern (lithography pattern) 4 formed by interdigitating two continuous comb-like opaque area patterns 2 and 3. As shown in FIG. 1a, the mask pattern 4 includes one continuous transparent area pattern 1. The size of each of the comb-like opaque area patterns 2 and 3 is defined by the transparent area pattern 1 adjacent thereto. An interdigitating portion of the transparent area pattern 1 and the opaque area patterns 2 and 3 have a width of 0.25 μm, when transferred on a substrate (that is, a wafer). In a case where a 1/10 reduction, projection aligner is used, a corresponding pattern width on a reticle is 2.5 μm. When a phase shifting layer 5 is formed on the transparent area pattern 1 as shown in FIG. 1b in accordance with the conventional method, to produce the 180° phase difference between exposure beams passing through adjacent transparent area pattern segments 6 having an opaque area pattern segment 7 therebetween, thereby improving the resolution of the lithography pattern. The exposure beam having passed through the transparent area pattern segment 6 not coated with the phase shifting layer 5 is subjected to no phase shift, but the exposure beam having passed through the transparent area pattern segment 6 coated with the phase shifting layer 5 is subjected to a phase shift of 180°. A 180° phase difference is produced between exposure beams having passed through adjacent transparent area pattern segments 6 having the opaque area pattern segment 7 therebetween. Thus, two exposure beams having passed through the lithography mask pattern 4' of FIG. 1b are opposite in phase to each other. Accordingly, the light intensity distribution on the substrate is excellent in contrast. That is, the light intensity on a surface area of the wafer corresponding to a transparent area is greatly different from the light intensity on another surface area of the wafer corresponding to an opaque area, and thus the resolution of the pattern formed on the wafer is greatly improved. In the meandering transparent area pattern 1 shown in FIG. 1b and having the opaque area pattern segment 7 between adjacent transparent area pattern segments 6, however, the arrangement of the phase shifting layer 5 by the conventional method brings about an abrupt change in intensity of exposure light at a portion 8 of the transparent area pattern 1. That is, the phase of exposure light is changed from 0° to 180° and vice versa at this portion 8, and the intensity of exposure light becomes zero at that area of the wafer which corresponds to the portion 8. Thus, a transparent area pattern on the wafer is separated into a plurality of parts. That is, a meandering transparent area pattern on the wafer becomes discontinuous. As a result, interdigitated comb-like opaque area patterns on the wafer are connected with each other.

Figure 1C:
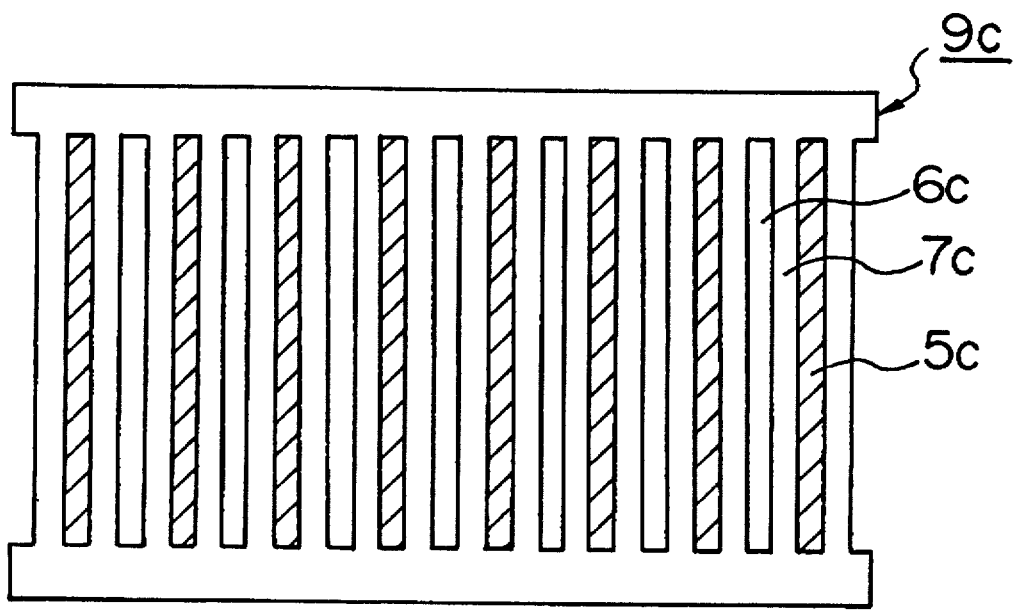
Figure 1D:
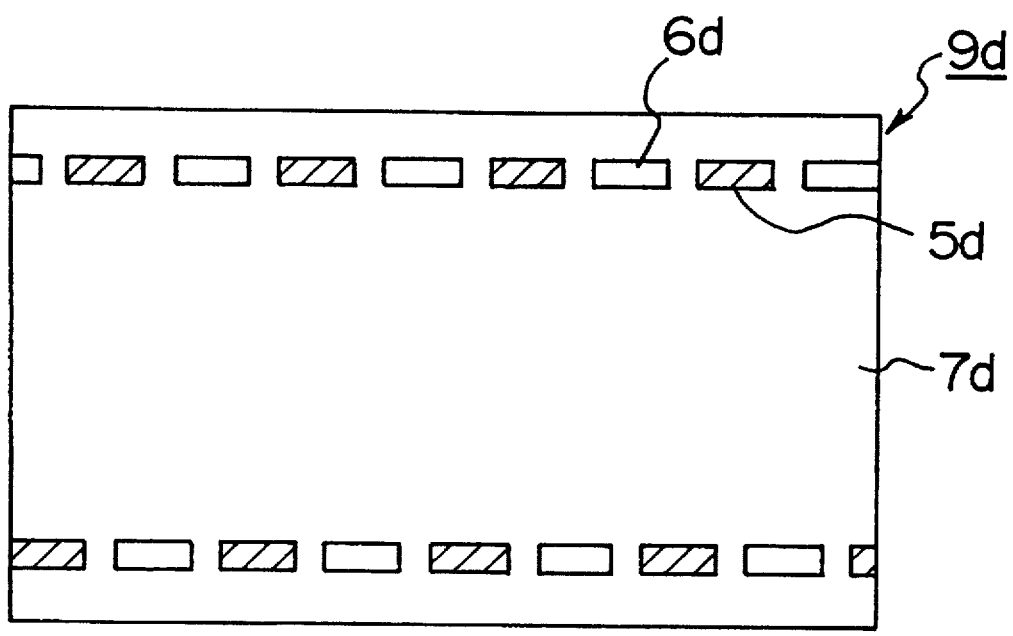

FIGS. 1c and 1d shows device patterns 9c and 9d which are optically combined (that is, optically superposed on each other) to realize the lithography mask pattern of FIG. 1a, respectively. The continuous, meandering transparent area pattern 1, as shown in FIGS. 1c and 1d, is separated into transparent pattern segments 6c and transparent pattern segments 6d in such a manner that the transparent pattern segments 6c are isolated from one another by an opaque area 7c and the transparent pattern segments 6d are isolated from one another by an opaque area 7d. A transparent partial pattern is constituted of the transparent pattern segments 6c, and another transparent partial pattern is constituted of the transparent pattern segments 6d. In the device patterns 9c and 9d having one and the other of the transparent partial patterns, respectively, as shown in FIGS. 1c and 1d, the transparent pattern segments 6c are alternately provided with a phase shifting layer 5c, and the transparent pattern segments 6d are alternately provided with a phase shifting layer 5d. Exposure light having passed through each of the transparent partial patterns of the device patterns 9c and 9d is classified into two exposure beams by the phase shifting layer 5c or 5d which is formed on one of the adjacent transparent pattern segments 6c or 6d having the opaque area 7c or 7d therebetween, and a phase difference of 180° is produced between the exposure beams (a phase shifting pattern is formed of each of the phase shifting layers 5c and 5d). In more detail, the exposure beam having passed through the transparent pattern segment 6c or 6d which is not coated with the phase shifting layer 5c or 5d, is not subjected to any phase shift, and the exposure beam having passed through the transparent pattern segment 6c or 6d coated with the phase shifting layer 5c or 5d is subjected to a phase shift of 180°. In the transparent partial patterns of the device patterns 9c and 9d, adjacent transparent pattern segments 6c or 6d are isolated by the opaque area 7c or 7d. Accordingly, there is no fear of generating the boundary portion 8 of FIG. 1b where the phase of exposure light is changed from 0° to 180° and vice versa and thus a continuous transparent pattern is substantially separated into two parts.

In the present embodiment, the phase shifting layers 5c and 5d are formed of an $SiO_2$ film having a thickness of about 0.38 μm. This value is determined by using the following equation:

$$t = \frac{\lambda}{2(n-1)}$$

where t indicates the thickness of the $SiO_2$ film, n the refractive index of $SiO_2$, and λ the wavelength of exposure light. Since the $SiO_2$ film having the above thickness is used as the phase shifting layers 5c and 5d, the exposure light having passed through the transparent pattern segments 6c or 6d provided with the phase shifting layer 5c or 5d is 180° out of phase with the exposure light having passed through the transparent pattern segments 6c or 6d having no phase shifting layer. In FIGS. 1c and 1d, the phase shifting layers 5c and 5d are made equal in shape to the transparent pattern segments 6c and 6d, respectively. That is, the phase shifting layers 5c and 5d on a reticle whose pattern is ten times as large as a pattern formed on a substrate, have a width of 2.5 μm. The phase shifting layer 5c or 5d is formed for shifting the phase of exposure light passing through the transparent pattern segments 6c or 6d. Accordingly, the phase shifting layer 5c or 5d may be extended on that portion of the opaque area 7c or 7d which is contiguous to the transparent pattern segment 6c or 6d coated with the phase shifting layer 5c or 5d. The principle of the phase shifting method, however, does not allow the phase shifting layer 5c or 5d to extend to the transparent pattern segment 6c or 6d adjacent to the transparent pattern segment 6c or 6d coated with the phase shifting layer 5c or 5d, through the opaque area 7c or 7d.

Where an i-line, 1/10 reduction, projection aligner using an exposure wavelength of 365 nm and a reduction lens having a numerical aperture of 0.42 is used for transferring a pattern of the phase shift reticle thus formed to a photosensitive film on a substrate (that is, wafer), a blind-shaped partial pattern which is similar to the transparent partial pattern of FIG. 1c and which has a minimum width of 0.25 μm, and a hole-shaped partial pattern which is similar to the transparent partial pattern of FIG. 1d and which has a minimum width of 0.25 μm, are formed on the photosensitive film with high resolution.

In the above, explanation has been made of a case where a pattern transfer method according to the present invention is carried out with an i-line, 1/10 reduction, projection aligner using an exposure wavelength of 365 nm and provided with a reduction lens having a numerical aperture of 0.42. In a case where a conventional pattern transfer method which does not use the above device patterns having the phase shifting patterns is carried out by the above-mentioned, i-line aligner, the resolution limit of a pattern formed on the photosensitive film is about 0.5 μm. Thus, according to the present embodiment, the resolution limit is improved from 0.5 μm to 0.25 μm. That is, the resolution limit is increased by 50%, and a fine pattern having a minimum size of 0.25 μm can be formed on the photosensitive film.

According to the present embodiment, the exposure wavelength λ of the aligner can be made shorter than above. Even in a case where an excimer layer beam or X-rays are used in place of the i-line, the resolution limit of a pattern formed on the photosensitive film can be improved by about 50%. Thus, an ultra fine pattern and a device having such an ultra fine pattern can be formed.

Figure 2:
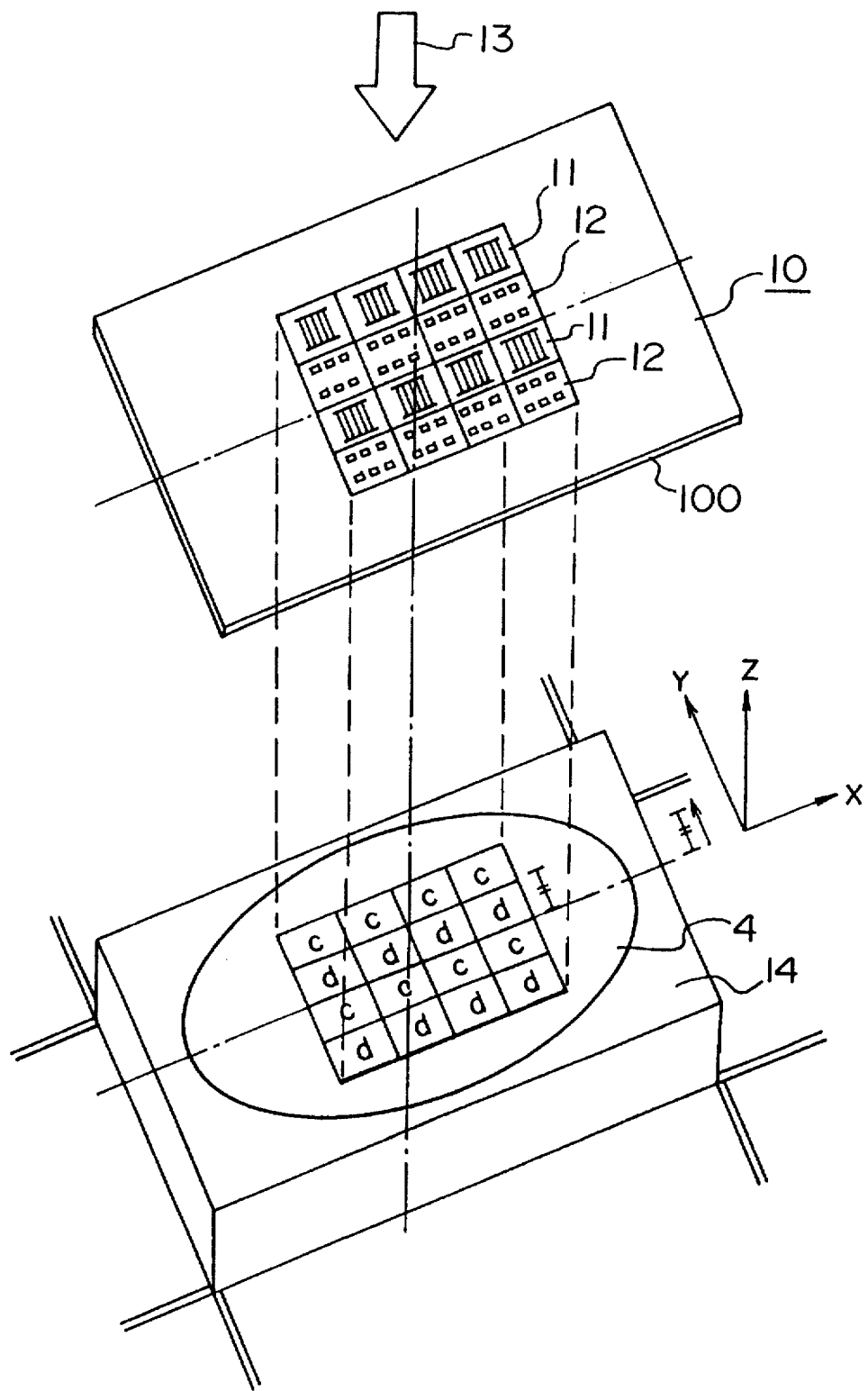
FIG. 2 is a schematic diagram for explaining a mask structure according to an embodiment of the present invention, and the transfer of pattern using the mask structure.

FIG. 2 shows an embodiment of the present invention. A mask structure 10 is made by forming a plurality of device patterns 9c and a plurality of device patterns 9d as shown in FIGS. 1c and 1d; on a single transparent support plate, and the transfer of pattern is carried out by using the mask structure 10. As shown in FIG. 2, the device patterns 9c and 9d which include the transparent partial patterns 6c and 6d also shown in FIGS. 1a and 1d, respectively, are formed on a transparent support plate 100 in such a manner that rows of device patterns 9c and rows of device patterns 9d are alternately arranged. That is, each of the pattern rows 11 includes a plurality of device patterns 9c as shown in FIG. 1c, and each of the pattern rows 12 includes a plurality of device patterns 9d as shown in FIG. 1d. In this embodiment, the rows 11 of device patterns 9c constitute a first group of device patterns while the rows 12 of device patterns constitute a second group of device patterns. The device patterns included in each of the device pattern rows are provided with the phase shifting pattern 6c or 6d shown in FIG. 1c or 1d. The minimum size of the phase shifting pattern on the reticle whose pattern is ten times as large as a pattern formed on a substrate, is 2.5 μm. Further, each of the device patterns included in the device pattern rows 11 and 12 has a size of 35 mm×35 mm, and the device patterns are regularly arranged at an interval of 35 mm.

A wafer 4 provided with a photosensitive film is exposed to exposure light 13 through the mask structure 10 where the device patterns and the device pattern rows are arranged in the above-mentioned manner, to transfer the device patterns to the wafer 4. This exposure operation can be performed by the abovementioned, 1/10 reduction, projection aligner.

Thus, partial patterns c and d of FIGS. 1c and 1d each having a minimum size of 0.25 μm can be formed on the wafer 4 at an interval of 3.5 mm. That is, partial pattern rows each including a plurality of 3.5 mm×3.5 mm chips are arranged on the wafer.

Thereafter, a substrate stage 14 included in the aligner for supporting the wafer 4 as shown in FIG. 2 is moved in a Y-direction (shown in FIG. 2) by a distance of 3.5 mm, and then the second exposure operation is performed to transfer the device patterns to the wafer 4. Thus, a row of partial patterns c is superposed on a row of partial patterns d. Thus, the partial patterns c and d are combined on a single chip to form a desired pattern.

Figures 3A, 3B, 3C:
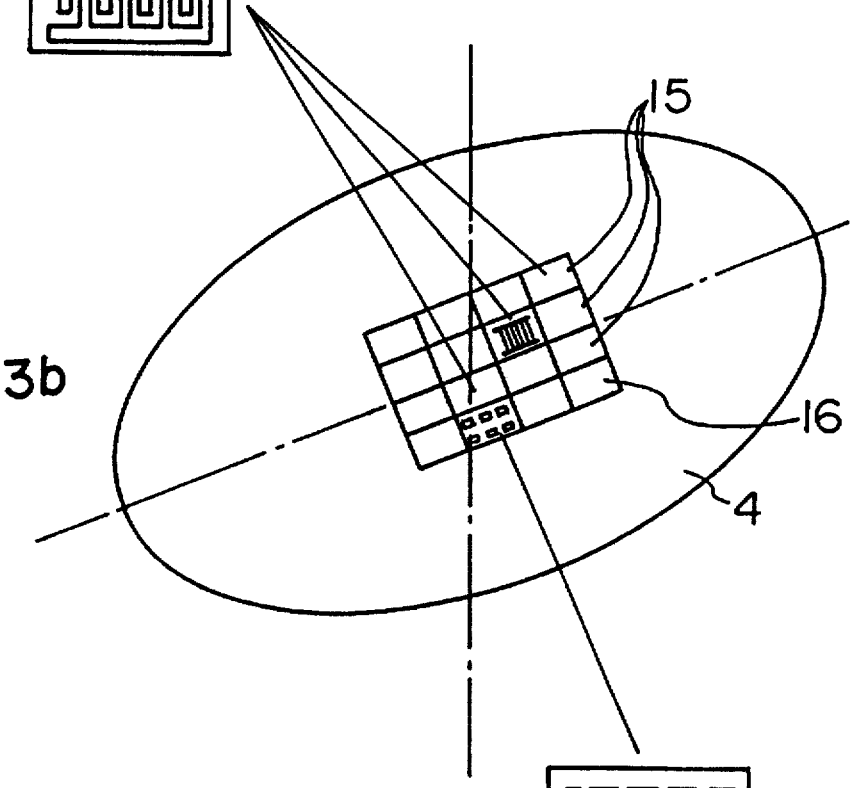
FIGS. 3a to 3c is a schematic diagram for explaining a pattern which is formed on a substrate (that is, wafer) by performing an exposure operation twice for the mask structure of FIG. 2.

FIG. 3 shows a pattern which is formed on the wafer 4 in the manner having been explained with reference to FIG. 2. As shown in FIG. 3, in each of chips included in each of pattern rows 15, a comb-like, interdigital pattern having a continuous aperture pattern similar to the meandering transparent area pattern 1 of FIG. 1c is formed.

Further, in a pattern train 16 where the exposure operation has been performed only once, pattern synthesis or optical combination of device patterns is not made, but only a hole-shaped partial pattern is formed. However, when an additional row 11 of device patterns 9c is formed on the transparent support plate 10 of FIG. 2, the interdigital pattern can be formed over the whole effective area of the wafer 4 of FIG. 3. As mentioned above, when the blind-shaped transparent partial pattern 9c of FIG. 1c is optically combined with the hole-shaped transparent partial pattern 9d of FIG. 1d, an interdigital pattern which is similar to the mask pattern of FIG. 1a and has a minimum size of 0.25 μm, can be formed on the substrate with high resolution.

As mentioned above, according to the present embodiment, a pattern having a continuous transparent pattern can be formed on a substrate by performing an exposure/transfer operation which uses each of two or more device patterns including transparent partial patterns due to the decomposition of a transparent area pattern, a plurality of times. That is, exposure light passes through each of the transparent partial patterns 6c and 6d of separate device patterns 9c and 9d, and thus there is no fear of generating the separation of pattern at a surface area of the substrate corresponding to the boundary portion 8 of FIG. 1b. Accordingly, a fine pattern where the size of an opaque pattern segment is defined by a single continuous transparent area adjacent thereto, such as a lithography mask pattern having a meandering transparent pattern, can be transferred to a substrate with high resolution. Thus, an interdigital pattern can be formed which includes transparent and opaque areas each having a width of about 0.25 μm at a comb-tooth portion where transparent and opaque patterns are interdigitated. When the abovementioned pattern forming method is applied to an aligner using an excimer laser beam and having a resolution limit of about 0.25 μm, the resolution limit is improved to 0.125 μm, that is, the resolution limit is improved by about 50%. When the pattern forming method is applied to an aligner using X-rays and having a resolution limit of 0.1 μm, the resolution limit is improved to 0.05 μm. Further, in the present embodiment, the reduction/projection method is used. The above-mentioned pattern forming method, however, is applicable to the contact exposure method using deep ultraviolet rays. Although a case where a positive photo-resist film is used, has been explained in the present embodiment, the above pattern forming method is applicable to a case where a negative photo-resist film is used.

In the present embodiment, a lithography mask pattern is decomposed into device patterns, and a plurality of groups of device patterns are cyclically arranged on a single transparent support plate to form a mask structure. Accordingly, it is unnecessary to use a plurality of photo masks, and a multiplicity of identical patterns can be formed on the same wafer in a short time.

Figure 4B:
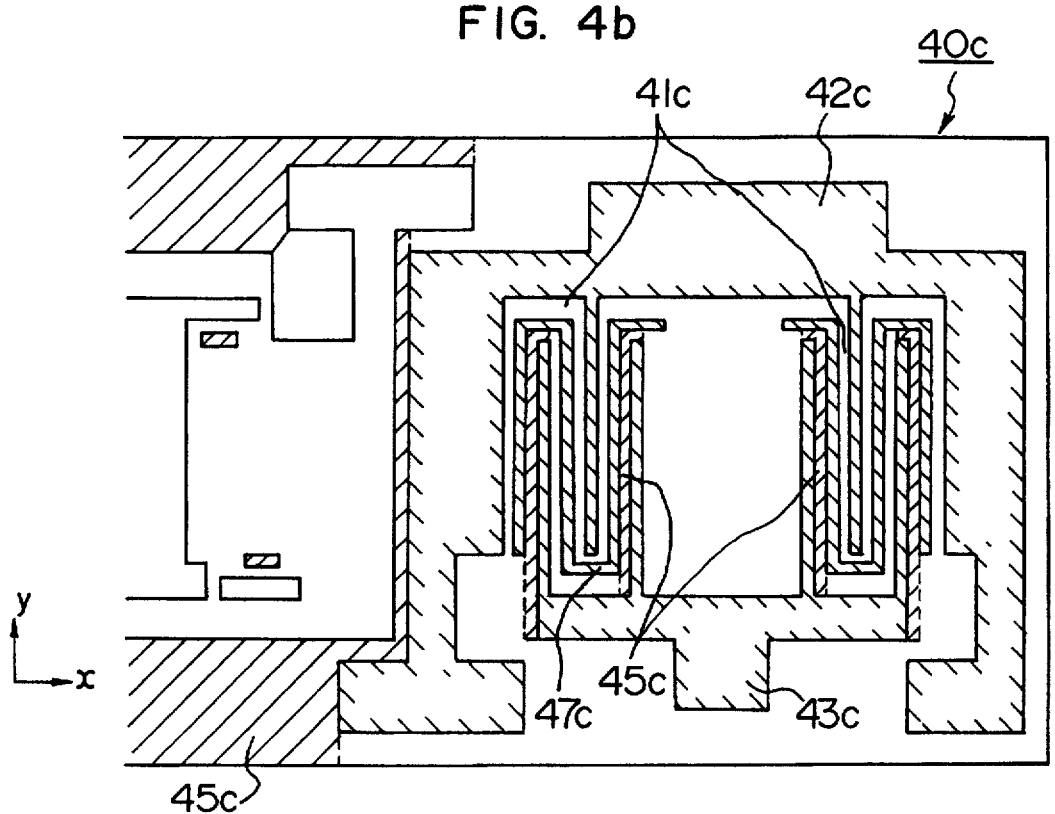
Figure 4C:
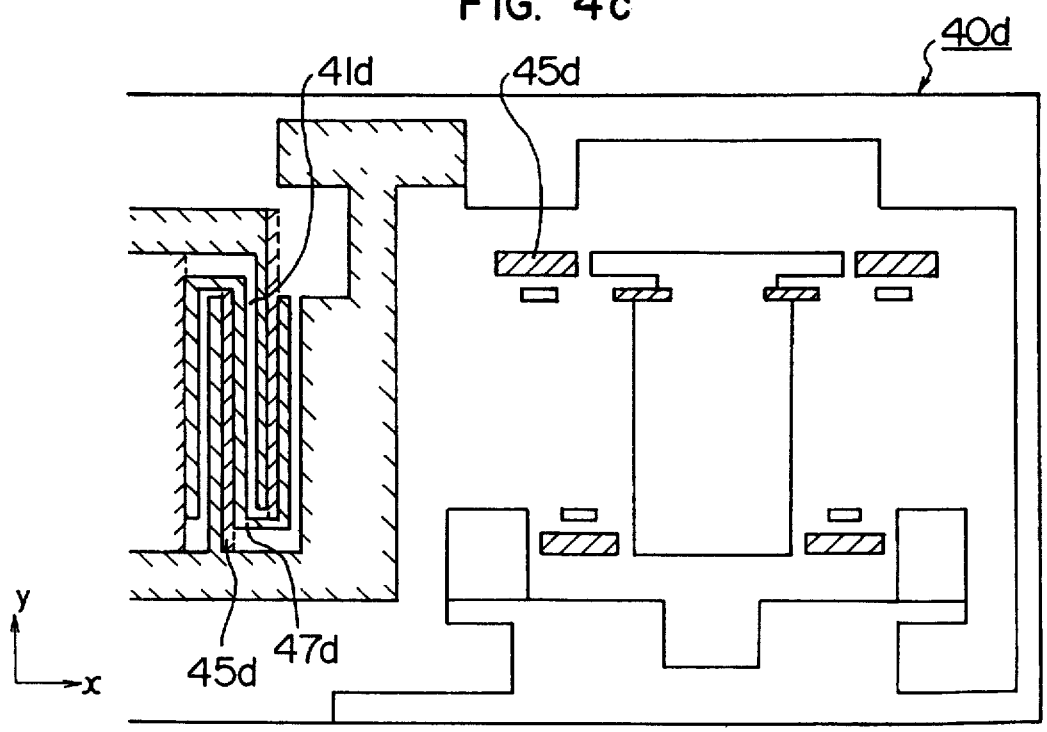

FIGS. 4a to 4c are schematic diagrams for explaining another embodiment of the present invention. FIG. 4a shows a lithography mask pattern which may be used to form an interdigital electrode for exciting a surface acoustic wave (SAW) in a piezo-electric substrate. Referring to FIG. 4a, a phase difference of 180° is produced between exposure light beams having passed through a transparent area pattern 41, by forming a phase shifting layer (that is, a phase shifting pattern) 45 as shown in FIG. 4a. However, when the phase shifting pattern 45 is formed, in accordance with the prior art, such that a 0°-phase and a 180°-phase are alternately imparted to exposure beams having passed through two adjacent transparent areas (the areas having a width of 0.25 μm) in the transparent area pattern 41 spaced from each other by an opaque area pattern 42 or 43, two adjacent areas such as those enclosed by 18 and/or 19 may undesirably serve to impart a 0°-phase to the exposure beams having passed therethrough, since the lithography mask pattern 40 includes a floating electrode pattern 47 and is made complicated thereby, as shown in FIG. 4a. The phase shifting pattern 45 has no effect on exposure light passing through the adjacent transparent pattern segments 18 or 19, and a transferred pattern corresponding to the adjacent transparent pattern segments 18 or 19 is low in resolution.

When a mask structure is formed in a manner shown in FIGS. 1a to 3, and an exposure operation is performed by using the mask structure, exposure beams having passed through such adjacent transparent pattern segments will not have the same phase. Thus, a pattern corresponding to the adjacent transparent pattern segments will be formed on a substrate with high resolution. In more detail, a pattern obtained by removing the phase shifting pattern 45 from the lithography mask pattern 40 of FIG. 4a, is realized by a mask structure which is obtained by forming a plurality of device patterns 40c (shown in FIG. 4b) and a plurality of device patterns 40d (shown in FIG. 4c) on a single transparent support plate.

In the device pattern 40c of FIG. 4b, a transparent partial pattern 41c and a phase shifting pattern 45c are determined so that the resolution with respect to a region of the transparent area pattern 41 of FIG. 4a is improved, for example, in an x-direction. Reference symbols 42c, 43c and 47c designate some portions of the opaque area patterns shown in FIG. 4a. Meanwhile, in the device pattern 40d of FIG. 4c, a transparent partial pattern 41d and a phase shifting pattern 45d are determined so that the resolution with respect to the transparent area pattern 41 of FIG. 1a is improved in a y-direction. Incidentally, reference symbol 47d designates a portion of the opaque area pattern shown in FIG. 4a.

A mask structure is made by forming a plurality of device patterns 40c and a plurality of device patterns 40d on a single transparent support plate, and an exposure operation using the mask structure is twice performed in a manner shown in FIGS. 2 and 3 to superpose the transparent partial patterns 41c and 41d optically on each other. Thus, a pattern corresponding to the complicated, fine pattern of FIG. 1a can be formed on a substrate with high resolution.

Further, according to the present embodiment, a SAW element can be formed which has the fine, interdigital electrode structure shown in FIG. 4a and a line width of about 0.25 μm. Thus, a mobile communication terminal apparatus and an ultra-high-speed optical communication apparatus can be made which use a semi-microwave band between 1 and 3 GHz and a high frequency band of about 10 GHz, respectively.

Figure 5A:
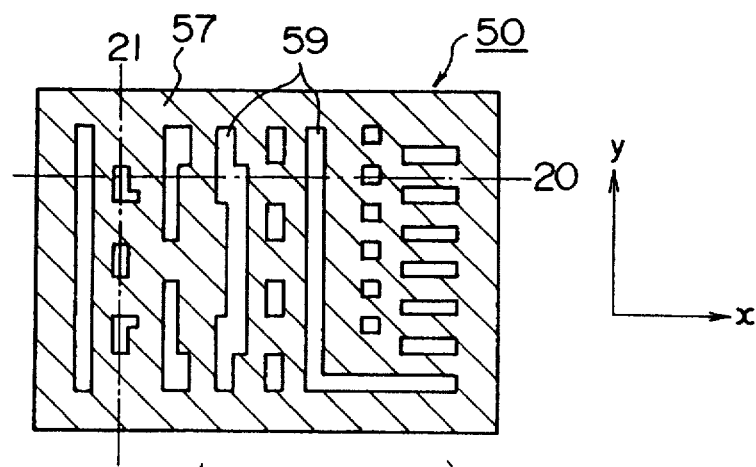
FIGS. 5a to 5c and 6a to 6d are schematic diagrams for explaining other embodiments of the present invention.

Next, a further embodiment of the present invention will be explained, with reference to FIGS. 5a to 5c. FIG. 5a shows a lithography mask pattern 50 in which a plurality of transparent pattern segments are arranged in an opaque area 57 and are isolated from one another by fine opaque area pattern segments. Referring to FIG. 5a, transparent pattern segments 59 transmitting exposure light are arranged in the opaque area 57 so that the transparent pattern segments 59 are isolated from one another. A minimum size of the transparent pattern segments 59 is 0.25 μm. When the transparent pattern segments 59 are alternately provided with a phase shifting layer in an x-direction 20, to improve the resolution of a transferred pattern, an exposure beam having a phase angle of 0° and an exposure beam having a phase angle of 180° are alternately produced in the x-direction 20. Thus, the resolution of the transferred pattern in the x-direction is improved. In this case, however, exposure beams having passed through two transparent pattern segments which are adjacent to each other in a y-direction 21 perpendicular to the x-direction 20 through an opaque pattern segment, have the same phase. Accordingly, the resolution of the transferred pattern in the y-direction is not improved.

Figure 5B:
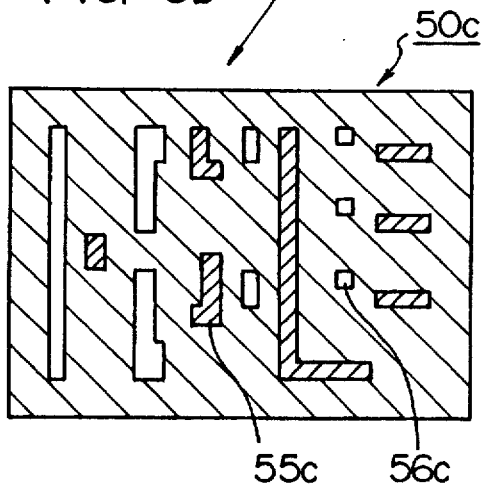
Figure 5C:
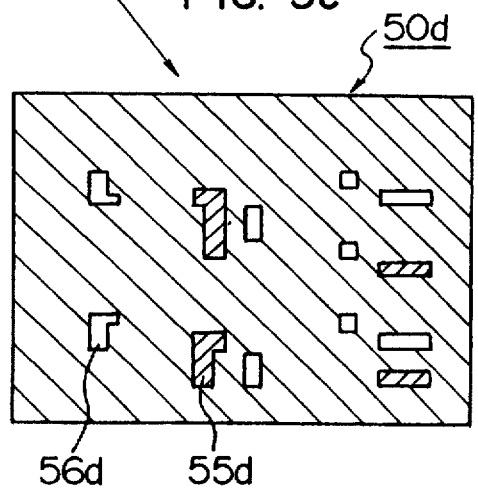

When a device pattern 50c having a transparent partial pattern 56c and a phase shifting pattern 55c, and when a device pattern 50d having a transparent partial pattern 56d and a phase shifting pattern 55d, are formed as shown in FIGS. 5b and 5c, a transparent pattern segment having a phase shifting layer and a transparent pattern segment having no phase shifting layer can be alternately arranged. Thus, a transferred pattern having a minimum size of 0.25 μm can be formed with high resolution.

When a plurality of device patterns 50c and a plurality of device patterns 50d are formed on a single transparent support plate to obtain a mask structure, and an exposure operation using the mask structure is twice performed as mentioned above, the same pattern as that shown in FIG. 5a is formed on each of chips included in a wafer.

As can be seen from above, according to the present embodiment, even a complicated wiring pattern can be formed with high resolution, and moreover a through-hole pattern necessary for making the fine electrode terminals of the wiring pattern can be formed.

Figure 6A:
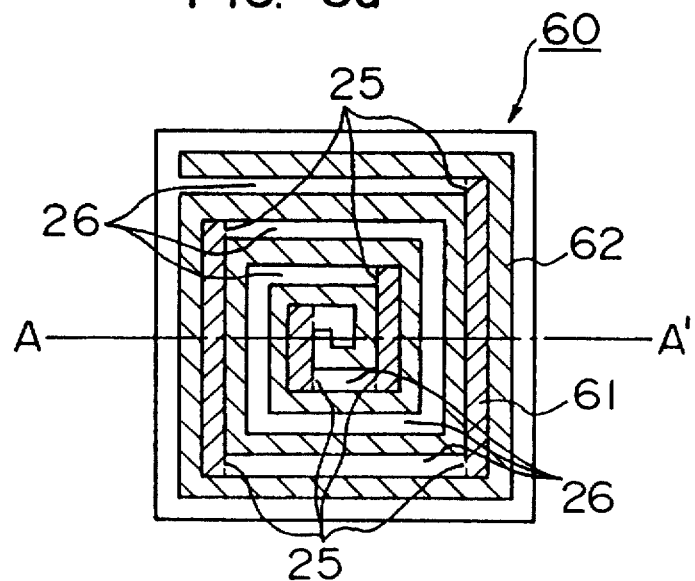
Figure 6B:
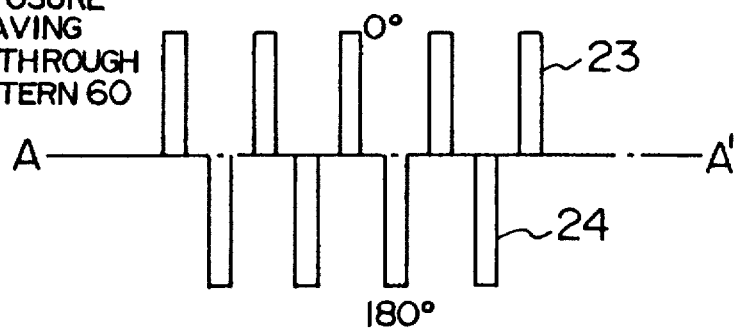

Still another embodiment of the present invention will be explained with reference to FIGS. 6a to 6d. FIG. 6a shows a lithography mask pattern 60 including a continuous opaque area pattern 62 for forming, for example, a spiral wiring pattern. In the lithography mask pattern 60 of FIG. 6a, the size of the opaque area pattern 62 for forming the wiring pattern is defined by a continuous transparent area pattern 61 transmitting exposure light. When transparent area portions parallel to a predetermined direction are alternately provided with a phase shifting layer to improve the resolution of a transferred pattern, exposure light having passed through the transparent area pattern 61 has the phase distribution shown in FIG. 6b, along the line A—A'. As shown in FIG. 6b, transmitted light 23 having a phase angle of 0° and transmitted light 24 having a phase angle of 180° are alternately arranged along the line A—A'. Thus, the resolution of the wiring pattern in a direction corresponding to the line A—A' is improved. In a case where the parallel transparent area portions are alternately provided with the phase shifting layer in accordance with a conventional method, however, exposure beams having passed through both sides of a part 25 of the transparent area pattern 61 are 180° out of phase with each other. Thus, the intensity of exposure light incident on a surface area of a substrate corresponding to the part 25 becomes equal to zero. Further, exposure beams which have passed through adjacent transparent area portions 26 having an opaque area portion therebetween, have the same phase. Accordingly, that part of a transferred pattern which corresponds to the transparent area portions 26 is low in resolution.

When a mask structure is formed in a manner shown in FIGS. 1a to 3, and an exposure operation using the mask structure is performed a plurality of times, a phase difference of 180° can be produced between exposure beams having passed through adjacent, parallel transparent area portions of a single continuous transparent area pattern. Thus, the resolution of a transferred pattern can be improved, and a fine wiring pattern can be formed.

Namely, the lithography mask pattern 60 of FIG. 6a from which the phase shifting pattern is removed, can be realized by a mask structure which is obtained by forming a plurality of device patterns 60c (shown in FIG. 6c) and a plurality of device patterns 60d (shown in FIG. 6d) on a single transparent support plate.

Figure 6C:
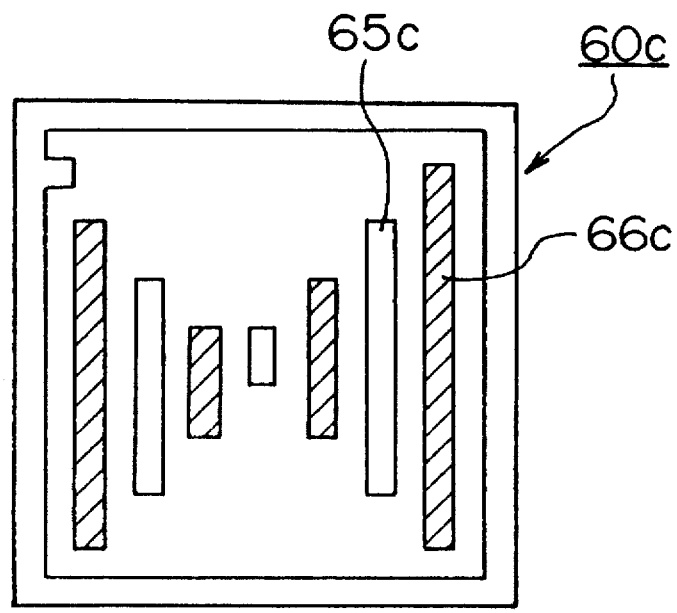
Figure 6D:
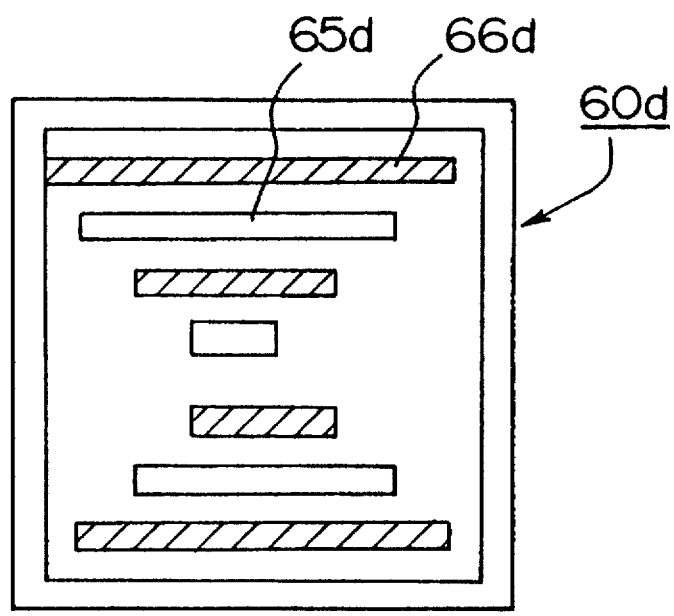

In the device pattern 60c of FIG. 6c, a transparent partial pattern 65c and a phase shifting pattern 66c are determined so that the resolution of a transferred pattern in a direction corresponding to the line A—A' of FIG. 6a is improved. Further, in the device pattern 60d of FIG. 6d, a transparent partial pattern 65d and a phase shifting pattern 66d are determined so that the resolution of the transferred pattern in a direction corresponding to a direction perpendicular to the line A—A' of FIG. 6a is improved.

We claim:

1. A method of manufacturing a device comprising the steps of:

preparing a preliminary pattern corresponding to said device which includes a combination of patterns transparent to exposure light and a background area opaque to the exposure light;

dividing at least one of said patterns into first and second area portions;

forming a first device pattern which includes a plurality of transparent pattern segments, wherein adjacent transparent pattern segments are separated by opaque material, at least one of said transparent pattern segments in said first device pattern is geometrically identical to the first area portion and another transparent pattern segment is geometrically identical to a first pattern not subjected to division;

forming a second device pattern which includes a plurality of transparent pattern segments, wherein adjacent transparent pattern segments are separated by opaque material, at least one of said transparent pattern segments in said second device pattern is geometrically identical to the second area portion and another transparent pattern segment is geometrically identical to a second pattern not subjected to division;

providing a phase shifter layer for causing a phase shift in said exposure light to one of said adjacent transparent pattern segments in each of said first and second device patterns;

preparing a substrate in which to form said device;

exposing said substrate to exposure light through one of said first and second device patterns; and exposing said substrate to exposure light through an other of said first and second device patterns.

2. The method according to claim 1, wherein said first and second device patterns are formed on separate mask plates.

3. The method according to claim 1, wherein said phase shift is 180°.

4. A method of manufacturing a mask structure for fabricating an electronic device comprising the steps of:

preparing a preliminary pattern corresponding to said device which includes a combination of patterns transparent to exposure light and a background area opaque to the exposure light;

dividing at least one of said patterns into first and second area portions;

forming a first device pattern which includes a plurality of transparent pattern segments, wherein adjacent transparent pattern segments are separated by opaque material, at least one of said transparent pattern segments in said first device pattern is geometrically identical to the first area portion and another transparent pattern segment is geometrically identical to a first pattern not subjected to division;

forming a second device pattern which includes a plurality of transparent pattern segments, wherein adjacent transparent pattern segments are separated by opaque material, at least one of said transparent pattern segments in said second device pattern is geometrically identical to said second area portion and another transparent pattern segment is geometrically identical to a second pattern not subjected to division; and providing a phase shifter layer for causing a phase shift in said exposure light to one of said adjacent transparent pattern segments in each of said first and second device patterns.

5. The method according to claim 4, wherein said phase shift is 180°.

6. A method of manufacturing a mask structure for fabricating an electronic device comprising the steps of:

preparing a preliminary pattern corresponding to said electronic device which includes a combination of a first pattern area assumed to be transparent to exposure light and a second pattern area assumed to be opaque to the exposure light;

dividing said first pattern area into a first group of area portions and a second group of area portions;

forming a first device pattern which includes a plurality of transparent pattern segments, wherein two adjacent transparent pattern segments are separated by an opaque material and each of said transparent pattern segments in said first device pattern is geometrically identical to one area portion of said first group;

forming a second device pattern which includes a plurality of transparent pattern segments, wherein two adjacent transparent pattern segments are separated by an opaque material and each of said transparent pattern segments in said second device pattern is geometrically identical to one area portion of said second group; and providing a phase shifter layer for causing a phase shift in said exposure light to one of said adjacent transparent pattern segments in each of said first and second device patterns.

7. The method according to claim 6, wherein said phase shift is 180°.

8. The method according to claim 6, wherein said first and second device patterns are formed on separate mask plates.

9. A method of manufacturing an electronic device comprising the steps of:

preparing a preliminary pattern corresponding to said device which includes a combination of a pattern transparent to exposure light and a background area opaque to the light;

dividing said pattern into n area portions where n is an integer not smaller than 2;

forming n groups of identical device patterns, wherein each device pattern in one device pattern group has transparent pattern segments separated by an opaque material and one transparent pattern segment identical to one of said area portions;

providing at least one of an adjacent pair of said transparent pattern segments separated by an opaque material in each device pattern, with a phase shifting layer for causing a phase shift in said exposure light;

preparing a substrate in which to form said device; and exposing said substrate to light passing through the n groups of device patterns.

10. The method according to claim 9, wherein said phase shift is 180°.

11. A method of manufacturing a mask structure for fabrication of a device, comprising the steps of:

preparing a preliminary pattern corresponding to said device which includes a combination of at least one pattern transparent to exposure light and a background opaque to the exposure light;

dividing said pattern into n area portions where n is an integer not smaller than 2;

forming n groups of identical device patterns, wherein each of said device pattern in one device pattern group has transparent pattern segments separated by an opaque material and one transparent pattern segment geometrically identical to one area portion; and providing at least one of an adjacent pair of said transparent pattern segments separated by an opaque material in each device pattern, with a phase shifting layer for causing a phase shift in said exposure light.

12. The method according to claim 11, wherein said phase shift is 180°.

13. A method of manufacturing an electronic device comprising the steps of:

preparing a preliminary pattern corresponding to said electronic device which includes a combination of pattern areas and background areas;

dividing at least one of pattern areas into first and second half area portions;

separating an undivided pattern area into first and second groups of undivided pattern areas;

forming a first device pattern which comprises pattern segments corresponding to the first group of undivided pattern areas and the first half area portion, the pattern segments being separated by an opaque pattern area;

forming a second device pattern which comprises pattern segments corresponding to the second group of undivided pattern areas and the second half area portion, the pattern segments being separated by another opaque pattern area;

providing a phase shifting layer for causing a phase shift in said exposure light to one of the pattern segments in each of said first and second device patterns;

preparing a substrate upon which to form said electronic device;

exposing said substrate to exposure light passing through said first device pattern; and exposing said substrate to exposure light passing through said second pattern.

* * * * *